US012787647B2

(12) United States Patent
Tanaka

(10) Patent No.: US 12,787,647 B2
(45) Date of Patent: Nov. 3, 2026

(54) PIEZOELECTRIC ELEMENT AND METHOD FOR MANUFACTURING PIEZOELECTRIC ELEMENT

(71) Applicant: STANLEY ELECTRIC CO., LTD., Tokyo (JP)

(72) Inventor: Haruki Tanaka, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 822 days.

(21) Appl. No.: 18/033,696

(22) PCT Filed: Oct. 18, 2021

(86) PCT No.: PCT/JP2021/038453
§ 371 (c)(1),
(2) Date: Apr. 25, 2023

(87) PCT Pub. No.: WO2022/091843
PCT Pub. Date: May 5, 2022

(65) Prior Publication Data
US 2023/0422621 A1 Dec. 28, 2023

(30) Foreign Application Priority Data
Nov. 2, 2020 (JP) ................................ 2020-183527

(51) Int. Cl.
*H01L 41/04* (2006.01)
*H10N 30/079* (2023.01)
(Continued)

(52) U.S. Cl.
CPC ....... *H10N 30/2044* (2023.02); *H10N 30/079* (2023.02); *H10N 30/8554* (2023.02); *G02B 26/0858* (2013.01); *G02B 26/101* (2013.01)

(58) Field of Classification Search
CPC ....................... H10N 30/2044; H10N 30/8554
(Continued)

(56) References Cited

U.S. PATENT DOCUMENTS

2011/0079883 A1 4/2011 Shimada et al.
2013/0250007 A1 9/2013 Ishimori et al.
(Continued)

FOREIGN PATENT DOCUMENTS

JP 2008035600 A 2/2008
JP 2011093788 A 5/2011
(Continued)

OTHER PUBLICATIONS

Extended European Search Report (EESR) dated Feb. 29, 2024, issued in counterpart European Application No. 21885962.7.
(Continued)

*Primary Examiner* — Derek J Rosenau
(74) *Attorney, Agent, or Firm* — Holtz, Holtz & Volek PC

(57) ABSTRACT

A piezoelectric element includes: a Pt film for a lower electrode provided on a plane of a Si substrate; a PZT film provided on the Pt film; and a Pt film for an upper electrode provided on the PZT film. The PZT film includes a perpendicularly oriented part having a c-axis in a direction perpendicular to the Pt film, and an obliquely oriented part having a c-axis inclined with respect to the c-axis of the perpendicularly oriented part. The c-axis distribution of the obliquely oriented part is discrete with respect to the c-axis distribution of the perpendicularly oriented part.

8 Claims, 12 Drawing Sheets

(51) Int. Cl.
*H10N 30/20* (2023.01)
*H10N 30/853* (2023.01)
*G02B 26/08* (2006.01)
*G02B 26/10* (2006.01)

(58) Field of Classification Search
USPC .................................. 310/311, 328, 330–332
See application file for complete search history.

(56) References Cited

U.S. PATENT DOCUMENTS

| | | | | |
|---|---|---|---|---|
| 2016/0341956 | A1 | 11/2016 | Yasuda | |
| 2017/0148974 | A1 | 5/2017 | Yonemura et al. | |
| 2017/0253040 | A1 | 9/2017 | Shinkai et al. | |
| 2018/0088320 | A1* | 3/2018 | Yamada ............. | H10N 30/2044 |

FOREIGN PATENT DOCUMENTS

| | | | |
|---|---|---|---|
| JP | 2013197522 | A | 9/2013 |
| JP | 2015195343 | A | 11/2015 |
| JP | 2016219603 | A | 12/2016 |

OTHER PUBLICATIONS

Goh, "Microstructure and growth mode at early growth stage of laser-ablated epitaxial Pb(Zr0.52Ti0.48)O3 films on a SrTi03 substrate", Journal of Applied Physics, American Institute of Physics, vol. 89, No. 8, (Apr. 15, 2001) pp. 4497-4502.

Yu, et al., "Distribution in orientation axis of thin film grown by pulsed laser deposition", Thin Solid Films, Elsevier, Amsterdam, NL, vol. 516, No. 6,(Dec. 23, 2007), pp. 907-911.

International Search Report (ISR) (and an English language translation thereof) dated Dec. 21, 2021, issued in International Application No. PCT/JP2021/038453.

Written Opinion dated Dec. 21, 2021, issued in International Application No. PCT/JP2021/038453.

* cited by examiner

FIG.11

| Evaluation item | Embodiment | Comparative form |
|---|---|---|
| Electric field resistance [V/μm] | 21.8 | 14.0 |
| Endurance time | 4000h or more | 1000h or less |
| $d_{31}$ [pm/V] | 152 | 152 |

PIEZOELECTRIC ELEMENT AND METHOD FOR MANUFACTURING PIEZOELECTRIC ELEMENT

TECHNICAL FIELD

The present invention relates to a piezoelectric element used for a light deflector and the like, and a method for manufacturing the piezoelectric element.

BACKGROUND ART

In recent years, there is an increasing need for sensor elements and actuator elements configured by systems having microstructures such as MEMS (Micro Electro Mechanical Systems). Hence, the development of a direct thin film forming method for forming a piezoelectric crystal film directly on a silicon wafer is progressing.

In particular, in piezoelectric actuators for MEMS using crystal films of lead zirconate titanate (PZT) as a piezoelectric material, orientation control is essential to obtain high piezoelectric properties.

For example, the piezoelectric actuator of Patent Literature 1 has a support and piezoelectric bodies formed on the support, and includes a plurality of piezoelectric cantilevers that bend and deform by piezoelectric drive. Further, the piezoelectric actuator independently includes a plurality of electrodes for applying drive voltages to the piezoelectric bodies of the plurality of piezoelectric cantilevers. The end portions of the plurality of piezoelectric cantilevers are mechanically connected such that the bend and deformation of each piezoelectric cantilever can be accumulated, and each piezoelectric cantilever is independently bent and deformed by the application of the drive voltage.

In the above-described piezoelectric actuator, the torque generated at the distal end portion of the piezoelectric cantilever and the amount of displacement thereof depend on the piezoelectric properties of the piezoelectric bodies and the size of the cantilevers. In other words, in order to obtain high piezoelectric properties, it is preferable to control the crystal orientation of the crystal film of a piezoelectric material.

CITATION LIST

Patent Literature

Patent Literature 1: Japanese Patent Application Laid-Open No. 2008-35600

SUMMARY OF INVENTION

Technical Problem

It has been possible to obtain high piezoelectric properties by controlling the crystal orientation of a PZT crystal film, which is a piezoelectric material used for a piezoelectric actuator (piezoelectric element). However, there has been a problem that the piezoelectric element cannot provide a sufficient endurance time.

The present invention has been made in view of the above-described circumstances, and it is an object of the invention to provide a piezoelectric element that improves endurance time while controlling the crystal orientation of the piezoelectric material of a piezoelectric element, and a method for manufacturing the piezoelectric element.

Solution to Problem

A piezoelectric element according to a first aspect of the invention includes: a substrate, at least one surface of which is a plane; a first electrode film provided on the plane of the substrate; a tetragonal piezoelectric crystal film provided on the first electrode film; and a second electrode film provided on a surface of the piezoelectric crystal film, the surface facing the first electrode film, wherein the piezoelectric crystal film is a uniaxially oriented polycrystalline body composed of columnar crystal grains with a c-axis of the tetragonal crystal oriented in a direction perpendicular to the first electrode film, the polycrystalline body includes a perpendicularly oriented part having a c-axis in a direction perpendicular to the first electrode film and an obliquely oriented part having a c-axis that is inclined with respect to the c-axis of the perpendicularly oriented part, each of the c-axis of the perpendicularly oriented part and the c-axis of the obliquely oriented part has a distribution, and a c-axis distribution of the obliquely oriented part is discrete with respect to a c-axis distribution of the perpendicularly oriented part.

The piezoelectric element according to the present invention includes the first electrode film, the tetragonal piezoelectric crystal film on the first electrode film, and the second electrode film provided on the piezoelectric crystal film. Here, the term "on ~" includes the case of no direct contact with a film on the lower surface side. The tetragonal crystal is a crystal in which axial lengths a, b, and c of a unit cell have a relationship of $a=b\neq c$. In addition, a <100> direction of the tetragonal crystal is an a-axis direction, a <010> direction is a b-axis direction, and a <001> direction is a c-axis direction, and the planes perpendicular to a <001> axis are a (001) surface and a c-plane.

The piezoelectric crystal film (columnar crystal grain boundary) of the present invention includes the perpendicularly oriented part and the obliquely oriented part having the c-axis oriented at an angle with respect to the c-axis of the perpendicularly oriented part. Further, the piezoelectric crystal film is displaced without impairing the properties thereof when a voltage is applied (when the voltage is increased), and returns to the original state thereof when the application is stopped (when the voltage is decreased). The piezoelectric crystal film including the obliquely oriented part of the present invention has a higher withstand voltage than a piezoelectric crystal film composed of only a perpendicularly oriented part. Further, in the piezoelectric crystal film, the c-axis distribution of the obliquely oriented part is discrete with respect to the c-axis distribution of the perpendicularly oriented part. Thus, it is possible to obtain a piezoelectric element with high long-term reliability due to the high withstand voltage without degrading the performance of the piezoelectric element.

In the piezoelectric element according to the first aspect of the present invention, the c-axis of the obliquely oriented part is preferably inclined in all circumferential directions from 0° to 360°, using the c-axis of the perpendicularly oriented part as the rotation axis thereof.

The c-axis of the perpendicularly oriented part is in the direction perpendicular to a plane of a substrate, whereas the c-axis of the obliquely oriented part is inclined in all circumferential directions (0° to 360°) using the c-axis of the perpendicularly oriented part as the rotation axis thereof. For this reason, the c-axis of the obliquely oriented part extends at any angle in a radial direction with respect to the c-axis of the perpendicularly oriented part.

Further, in piezoelectric element according to the first aspect of the present invention, a tilt angle ϕ of the c-axis of the obliquely oriented part with respect to the c-axis of the perpendicularly oriented part of the piezoelectric crystal film is preferably greater than 6° and below 19°.

The tilt angle ϕ of the c-axis of the obliquely oriented part is set to be greater than 6° and below 19°. This enables the piezoelectric crystal film including the obliquely oriented part to improve electric field resistance and endurance time and to prevent degradation of the piezoelectric properties.

In addition, in the piezoelectric element according to the first aspect of the present invention, an intensity ratio Rp in an X-ray rocking curve of the obliquely oriented part to the perpendicularly oriented part is preferably 0.1 to 1.

In the piezoelectric element, setting the intensity ratio Rp to the range of 0.1 to 1 makes it possible to enhance the effect by the obliquely oriented part. Thus, it is possible to prevent degradation of the piezoelectric properties due to an increase in orientation disorder of the piezoelectric crystal film.

Further, in the piezoelectric element according to the first aspect of the present invention, preferably, the piezoelectric crystal film is made of lead zirconate titanate (PZT) and the first electrode film is made of platinum (Pt).

According to the present invention, lead zirconate titanate (PZT) and platinum (Pt), which are the most suitable materials for the piezoelectric crystal film and the first electrode film, respectively, are used therefor. In particular, a piezoelectric element is created using PZT, which has high piezoelectric properties, as the piezoelectric crystal film. This makes it possible to, for example, perform high-speed drive at a low voltage to obtain a large scanning angle when the piezoelectric element is applied to an optical scanner module.

Further, in the piezoelectric element according to the first aspect of the present invention, the film surface of the first electrode film is preferably a (111) surface.

Setting the film surface of the first electrode film to a (111) surface makes it possible to improve the crystal orientation characteristics of the piezoelectric crystal film on the upper surface of the first electrode film when the piezoelectric crystal film is formed.

A method for manufacturing a piezoelectric element according to a second aspect of the present invention includes the steps of: depositing an amorphous metal oxide on a substrate, at least one surface of which is a plane; forming, on the metal oxide, a first electrode film made of a conductive metal film, a film forming surface of which is a (111) surface; forming an SRO film on the first electrode film; forming, on the SRO film, a piezoelectric crystal film, which is a tetragonal uniaxially oriented polycrystalline body having columnar crystal grains in a direction perpendicular to the first electrode film, and which has a perpendicularly oriented part having a c-axis in a direction perpendicular to the first electrode film and an obliquely oriented part having a c-axis inclined at a tilt angle ϕ with respect to the c-axis of the perpendicularly oriented part within a range of greater than 6° and below 19° in the columnar crystal grains; and forming a second electrode film provided on a surface of the piezoelectric crystal film, the surface facing the first electrode film.

The method for manufacturing a piezoelectric element according to the present invention includes the steps of depositing a metal oxide on a substrate, forming the first electrode film, forming the SRO film, forming the piezoelectric crystal film, and forming the second electrode film. The piezoelectric crystal film includes the perpendicularly oriented part and the obliquely oriented part having the c-axis oriented at an angle from the c-axis of the perpendicularly oriented part (the tilt angle ϕ of the c-axis being greater than 6° and below 190). The obliquely oriented part is displaced without impairing the properties thereof when a voltage is applied thereto (when the voltage is increased), and returns to the original state thereof when the application is stopped (when the voltage is decreased). This piezoelectric crystal film has a higher withstand voltage than a piezoelectric crystal film composed of only a perpendicularly oriented part. Thus, the performance of the piezoelectric element is not degraded, and the high withstand voltage makes the piezoelectric element highly reliable over the long term.

In the method for manufacturing a piezoelectric element according to the second aspect of the present invention, an arc discharge reactive ion plating method is preferably used in the step of forming the piezoelectric crystal film.

Using the are discharge reactive ion plating method makes it possible to efficiently form a piezoelectric crystal film having high quality and high adhesion.

BRIEF DESCRIPTION OF DRAWINGS

FIG. 11 is a list comparing the measurement results of the withstand field, the endurance time, and the piezoelectric constant of the PZT film with those of a comparative form.

DESCRIPTION OF EMBODIMENTS

The following will describe a piezoelectric element according to the present invention and a method for manufacturing the piezoelectric element with reference to the accompanying drawings.

Figure 1:
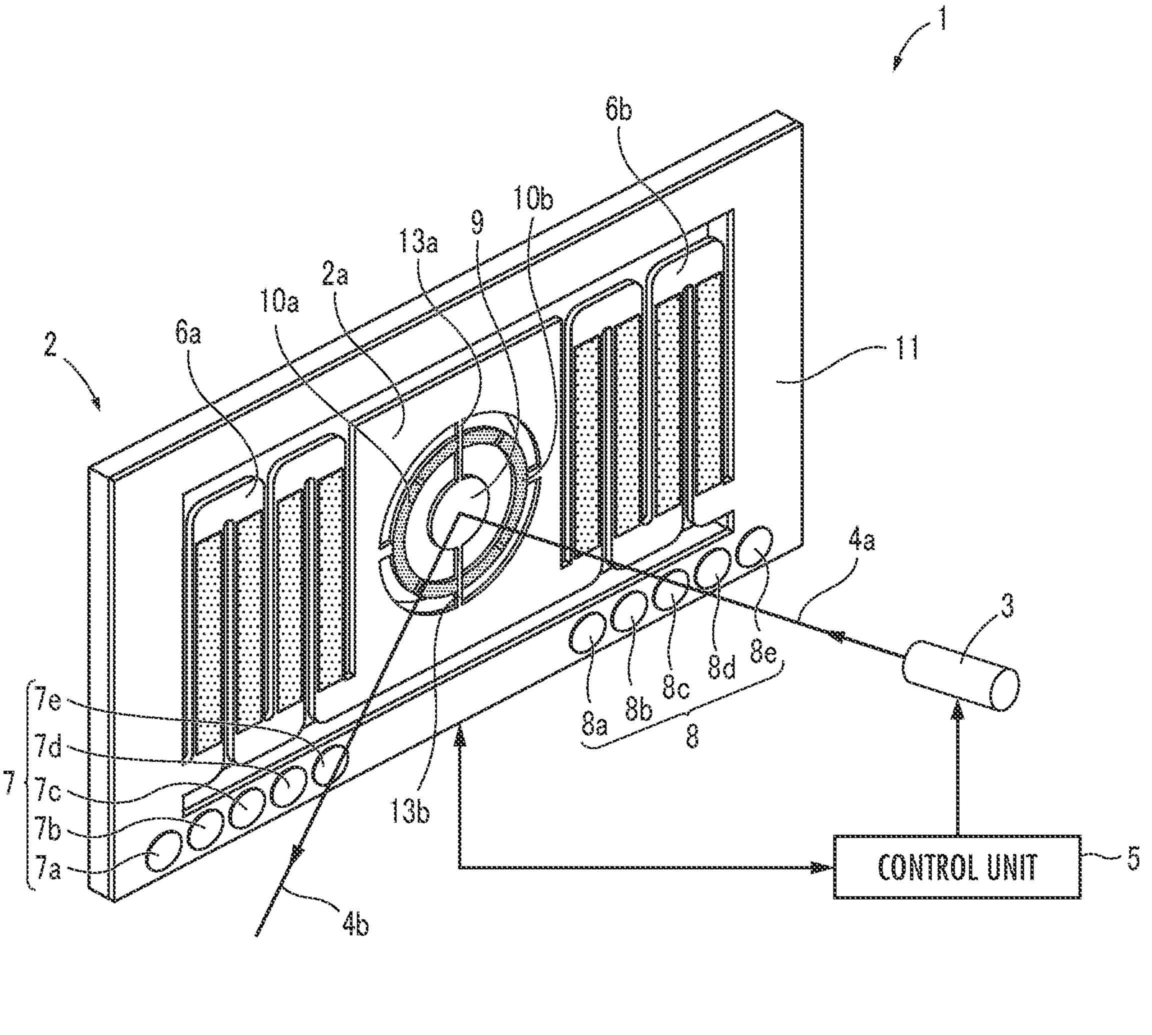
FIG. 1 is a schematic diagram of an optical scanner module including a piezoelectric element according to the present invention.

FIG. 1 is a schematic diagram of an optical scanner module 1 including a piezoelectric element of the present invention. The optical scanner module 1 is a device used in, for example, a pico projector, a head-up display, a vehicle headlight, and the like, and is mainly composed of a two-dimensional light deflector 2, a laser light source 3 and a control unit 5.

The two-dimensional light deflector 2 is fabricated using semiconductor processes or MEMS technology, and reflects incident light from a certain direction by a rotating mirror (micromirror 9) thereby to scan and emit the light.

A movable frame 2*a* of the two-dimensional light deflector 2 has the micromirror 9, semi-annular piezoelectric actuators 10*a* and 10*b*, torsion bars (elastic beams) 13*a* and 13*b*, and the like. Laser light 4*a* emitted from the laser light source 3 is incident on the rotating micromirror 9 and reflected, and the scanned emitted light (laser light 4*b*) scans, for example, the projection surface of a pico projector.

The control unit 5 transmits control signals to the movable frame 2*a* and the laser light source 3 by wiring, which is not illustrated. The control signals cause the semi-annular piezoelectric actuators 10*a* and 10*b* of the movable frame 2*a* to be driven. Then, the torsion bars 13*a* and 13*b* connected to the semi-annular piezoelectric actuators 10*a* and 10*b* are twisted thereby to rotate the micromirror 9. Further, the turning on/off and the brightness of the laser light 4*a* by the laser light source 3 are controlled by the control signals.

Figure 2:
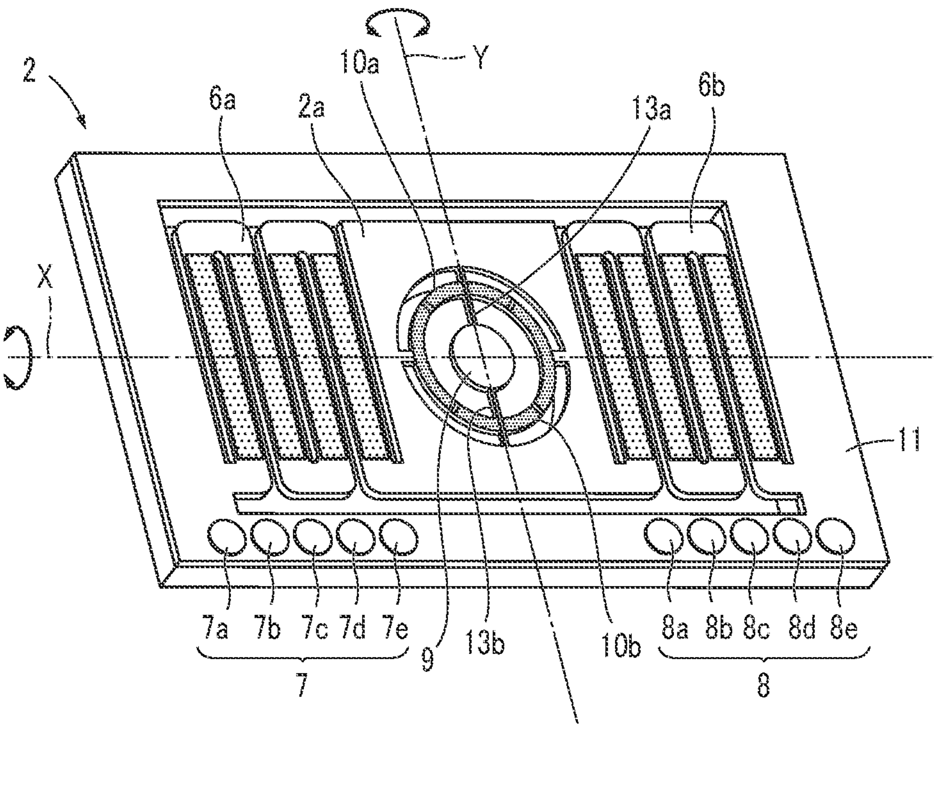
FIG. 2 is a perspective view of a two-dimensional light deflector included in the optical scanner module.

As illustrated in FIG. 2, in the two-dimensional light deflector 2, the movable frame 2*a* is disposed at the center of an outer frame support 11. In addition, meander-type piezoelectric actuators 6*a* and 6*b* are disposed on both sides of the movable frame 2*a*, and the outer sides of the movable frame 2*a* and the inner sides of the outer frame support 11 are connected.

The meander-type piezoelectric actuators 6*a* and 6*b* have a structure in which a plurality of cantilevers are arranged in parallel with their long sides adjacent to each other, folded back at the vertical ends, and connected in series. As described in detail later, the movable frame 2*a* rotates in a reciprocating manner in a horizontal direction, i.e., around an X-axis in the drawing, by also driving the meander-type piezoelectric actuators 6*a* and 6*b* by the control signals from the control unit 5.

Further, as described above, driving the semi-annular piezoelectric actuators 10*a* and 10*b* causes the micromirror 9 to rotate in a reciprocating manner around a Y-axis in the drawing, which coincides with the axes of the torsion bars 13*a* and 13*b*.

As a result, when reflecting the laser light 4*a* by the micromirror 9, the two-dimensional light deflector 2 can emit light to the front of the two-dimensional light deflector 2 and further scan in two directions, namely, an X-axis direction and a Y-axis direction.

The dotted portions of the meander-type piezoelectric actuators 6*a* and 6*b* and the semi-annular piezoelectric actuators 10*a* and 10*b* are regions of piezoelectric elements in which piezoelectric crystal films are formed. As will be described in detail later, the piezoelectric crystal film is composed of a perpendicularly oriented part oriented along an orientation axis and an obliquely oriented part oriented at a predetermined tilt angle with respect to the orientation axis. Consequently, the piezoelectric elements formed in the piezoelectric actuators are piezoelectric elements having high piezoelectric properties and high long-term reliability.

Electrode pads 7*a* to 7*e* (hereinafter referred to as the electrode pads 7) and electrode pads 8*a* to 8*e* (hereinafter referred to as the electrode pads 8) are disposed on the lower portion of the outer frame support 11. The electrode pads 7 and 8 are electrically connected such that drive voltages can be applied to the electrodes of the meander-type piezoelectric actuators 6*a* and 6*b* and the semi-annular piezoelectric actuators 10*a* and 10*b*.

The light deflector functions without the meander-type piezoelectric actuators 6*a* and 6*b*. In this case, the light deflector becomes a one-dimensional light deflector in which the portion of the movable frame 2*a* serves as the outer frame support, and the micromirror 9 rotates in a reciprocating manner around the Y-axis.

Figure 3A:
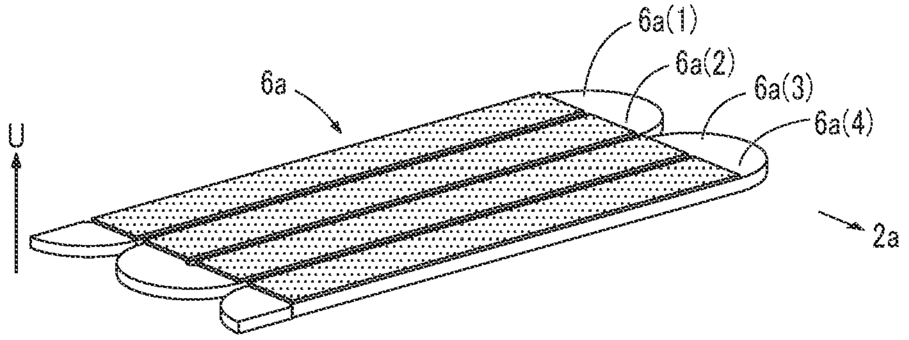
FIG. 3A is a diagram (1) illustrating the operation of a meander-type piezoelectric actuator of the two-dimensional light deflector.
Figure 3B:
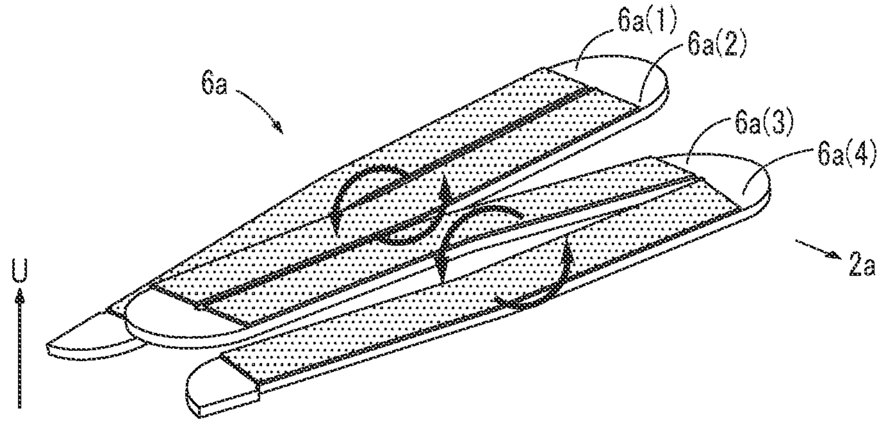
FIG. 3B is a diagram (2) illustrating the operation of the meander-type piezoelectric actuator of the two-dimensional light deflector.

Referring now to FIG. 3A and FIG. 3B, the operation of the meander-type piezoelectric actuator 6*a* will be described as an example.

As described above, the two-dimensional light deflector 2 enables the micromirror 9 to rotate around the X-axis in a reciprocating manner by operating the meander-type piezoelectric actuators 6*a* and 6*b* (hereinafter referred to as the piezoelectric actuators 6*a* and 6*b*).

FIG. 3A is a cutout diagram illustrating the piezoelectric actuator 6*a* disposed on the left side when the two-dimensional light deflector 2 of FIG. 2 is observed from the front side (indicating the side where the piezoelectric crystal films indicated by the dotted portions is seen in a top view, and may also be referred to as "the upward direction"). The piezoelectric actuator 6*a* has a shape in which four piezoelectric cantilevers are arranged. Further, each piezoelectric cantilever is composed mainly of a piezoelectric crystal film of lead zirconate titanate (PZT: Pb (Zr, Ti) $O_3$), which is a piezoelectric crystal, and electrode films sandwiching the piezoelectric crystal film, and has a piezoelectric element (details will be described later). Hereinafter, the piezoelectric cantilevers will be referred to as the piezoelectric cantilevers 6*a* (1), 6*a* (2), 6*a* (3), and 6*a* (4) in order from the one farthest from the movable frame 2*a*.

For example, in the meander-type piezoelectric actuator 6*a*, a first voltage is applied to the odd-numbered piezoelectric cantilevers 6*a* (1) and 6*a* (3). Further, a second voltage, which is opposite in phase to the first voltage, is applied to the even-numbered piezoelectric cantilevers 6*a* (2) and 6*a* (4).

In this way, as illustrated in FIG. 3B, the odd-numbered piezoelectric cantilevers 6*a* (1) and 6*a* (3) can be bent and deformed upward (convex in FIG. 3B). Further, the even-numbered piezoelectric cantilevers 6*a* (2) and 6*a* (4) can be bent and deformed downward (concave in FIG. 3B).

Although not illustrated, for the piezoelectric actuators 6*b*, the piezoelectric cantilevers will be referred to as the piezoelectric cantilevers 6*b* (1), 6*b* (2), 6*b* (3), and 6*b* (4) in order from the one closest to the movable frame 2*a*. At this time, the odd-numbered piezoelectric cantilevers 6*b* (1) and 6*b* (3) can be bent and deformed downward, and the even-numbered piezoelectric cantilevers 6*b* (2) and 6*b* (4) can be bent and deformed upward.

Consequently, the micromirror 9 can be displaced such that the lower side of the micromirror 9 (torsion bar 13*b* side) is pushed up, while the upper side of the micromirror 9 (torsion bar 13*a* side) is pushed down (the movable frame 2*a* moves in a U-direction around the X-axis). Similarly, the micromirror 9 can be displaced in the reverse direction by applying a reverse voltage to the piezoelectric cantilevers 6*a* (1) to (4) and 6*b* (1) to (4). Thus, the micromirror 9 can be rotated around the X-axis.

Figure 4:
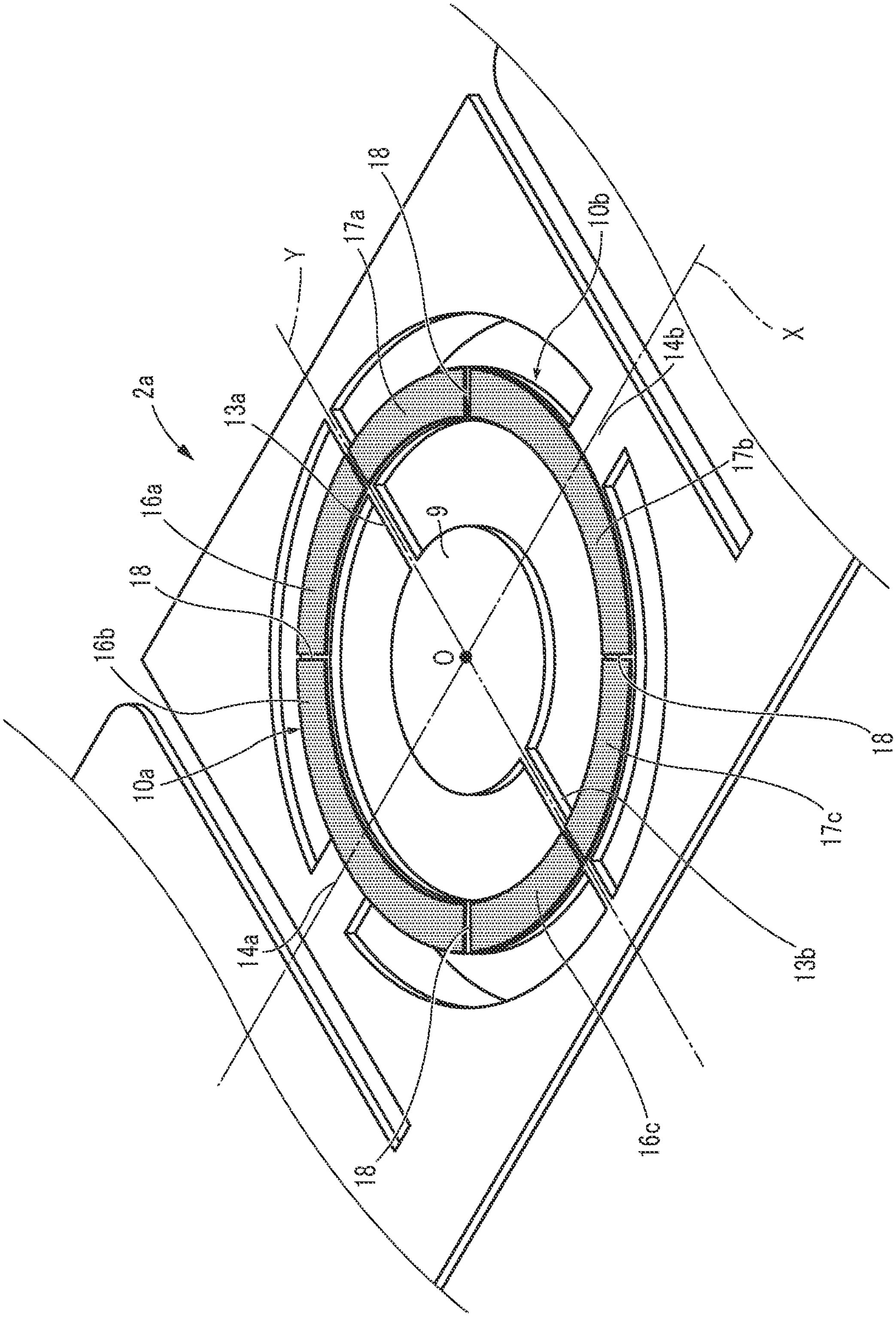
FIG. 4 is a diagram illustrating the details of the two-dimensional light deflector.

Referring now to FIG. 4, the movable frame 2*a* will be described in detail.

FIG. 4 is a perspective view of the movable frame 2*a* observed from the front at an angle. In an initial state, the micromirror 9 directs a normal extending from center O to the front side straight forward.

The circular micromirror 9 is supported by the torsion bars 13*a* and 13*b* in the Y-axis direction, and disposed at the center of the movable frame 2*a*. The reflecting surface of the micromirror 9 is formed by forming a metal thin film of gold (Au), platinum (Pt), aluminum (Al), or the like by, for example, a sputtering method or an electron beam deposition method. The shape of the micromirror 9 is not limited to a circular shape, and may alternatively be an elliptical shape or other shape.

One end of each of the torsion bars 13*a* and 13*b* is connected to the micromirror 9, and the other end thereof is connected to the movable frame 2*a* across the connection to the semi-annular piezoelectric actuators 10*a* and 10*b* (hereinafter referred to as the piezoelectric actuators 10*a* and 10*b*). The connection of the torsion bars 13*a* and 13*b* to the movable frame 2*a* as described above stabilizes the reciprocating rotation around the Y-axis.

The piezoelectric actuators 10*a* and 10*b* are disposed at positions surrounding the micromirror 9 from the outside. The piezoelectric actuators 10*a* and 10*b* are connected to the torsion bars 13*a* and 13*b* on the Y-axis and connected to fixed bars 14*a* and 14*b*, which are a part of the outer frame support 11, on the X-axis.

As will be described in detail later, each of the piezoelectric actuators 10*a* and 10*b* also has a piezoelectric element structure in which a PZT piezoelectric crystal film is sandwiched by a lower electrode and an upper electrode by semiconductor planar process. This is a mechanism in which a voltage is applied to the piezoelectric crystal film through the lower electrode and the upper electrode so as to cause the piezoelectric actuators 10*a* and 10*b* to bend and deform, thereby twisting the torsion bars 13*a* and 13*b*.

Each of the piezoelectric actuators 10*a* and 10*b* has dividing grooves 18 formed on straight lines inclined by 45° with respect to the Y-axis, thus dividing the piezoelectric crystal film in the circumferential direction. Further, the torsion bars 13*a* and 13*b* extend on the Y-axis, so that the piezoelectric crystal film is divided in the circumferential direction also at these positions.

When fabricating the movable frame 2*a* by the MEMS technology, first, the piezoelectric crystal film for the piezoelectric actuators 10*a* and 10*b* is uniformly formed on the entire circumference including the portions of the torsion bars 13*a* and 13*b*. Thereafter, the piezoelectric crystal film is removed by etching from the portions of the torsion bars 13*a* and 13*b* and the portions of the dividing grooves 18.

The piezoelectric actuator 10*a* is divided by the two dividing grooves 18 into sections 16*a* to 16*c* in order from the upper side. Meanwhile, the piezoelectric actuator 10*b* is divided by the two dividing grooves 18 into sections 17*a* to 17*c* in order from the upper side.

Consequently, a drive voltage can be individually applied to the piezoelectric crystal film of the sections 16*a* to 16*c* and 17*a* to 17*c*. For example, the micromirror 9 can be oscillated around the Y-axis by applying a predetermined voltage V1 to the sections 16*a*, 16*c*, and 17*b*, and applying a voltage V2, which has an opposite phase from that of V1, to the sections 16*b*, 17*a*, and 17*c*. By separating the piezoelectric crystal film as described above, the same deflection angle can be obtained with approximately half the voltage in the case of no separation, thus reducing power consumption. Further, the effect of the torsional spring action and reaction by the torsion bars 13*a* and 13*b* is also added, thus making it possible to reduce power consumption.

Figure 5:
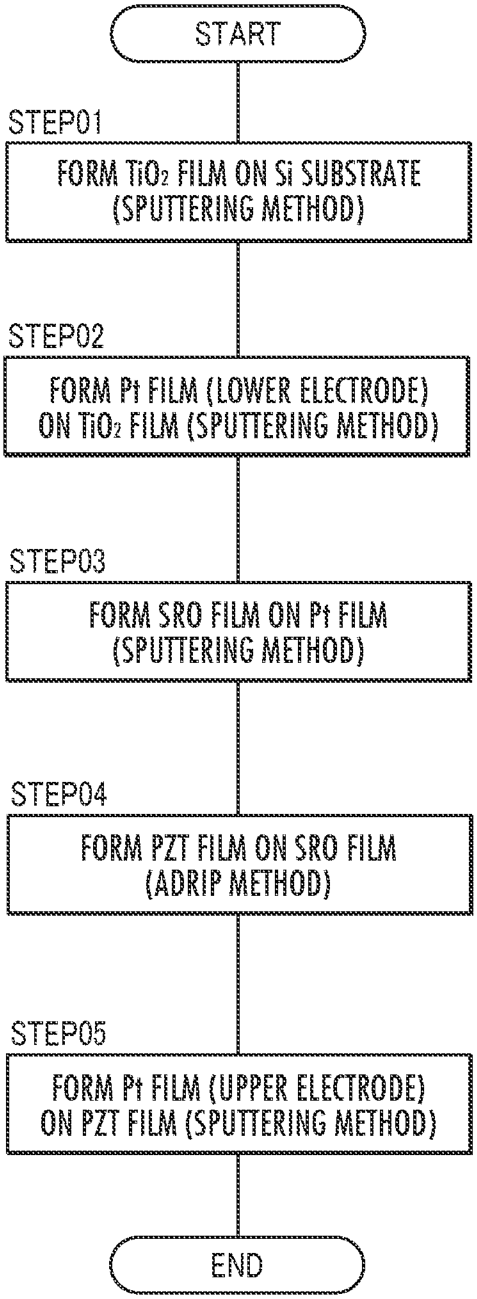
FIG. 5 is a flowchart for manufacturing the piezoelectric element according to the present invention.
Figure 6:
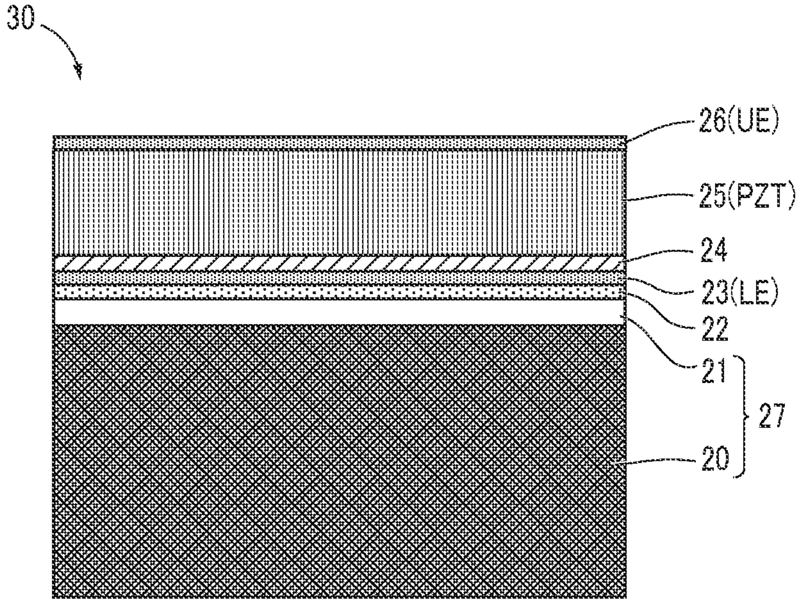
FIG. 6 is a diagram illustrating the cross-sectional structure of the piezoelectric element according to the present invention.
Figure 7:
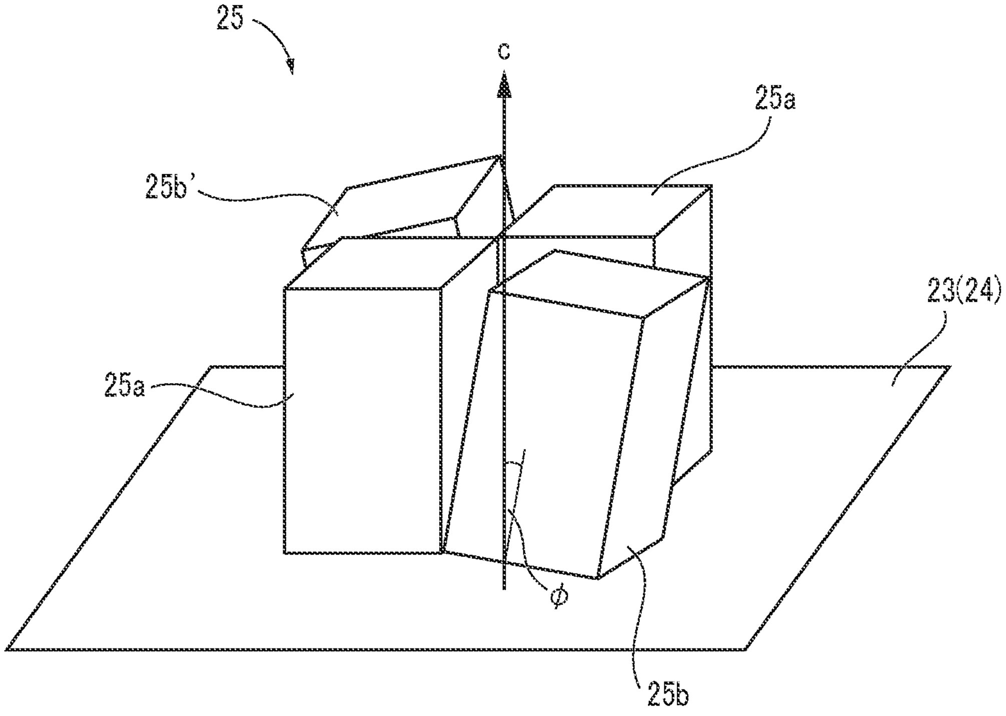
FIG. 7 is a diagram illustrating the crystal orientation image of the PZT film of the piezoelectric element of FIG. 6.

Referring now to FIG. 5 to FIG. 7, the structure of the piezoelectric element formed in each piezoelectric actuator, and the method for manufacturing the piezoelectric element will be described.

FIG. 5 is a flowchart for manufacturing the piezoelectric element. Further, FIG. 6 illustrates the cross-sectional structure of a piezoelectric element 30 manufactured by the manufacturing method of FIG. 5, and FIG. 7 illustrates the crystal orientation image of the PZT film 25 of the piezoelectric element 30.

First, a plate-shaped Si core substrate 27, on which a silicon oxide ($SiO_2$) film 21 having a film thickness of approximately 1 μm has been formed, is prepared on the upper surface of a 400 μm-thick silicon (Si) substrate 20 (refer to FIG. 6). Then, an amorphous titanium oxide ($TiO_2$) film 22 made of a metal oxide having a film thickness of 5 nm as an adhesion layer is formed on the Si core substrate 27 at room temperature (e.g., 20° C. to 30° C.) by a sputtering method (STEP01). The temperature at which the film is formed is the temperature of the Si core substrate 27 on which a film is to be formed.

Subsequently, a conductive Pt film 23 having a film thickness of 200 nm is formed as the lower electrode (a first electrode) on the upper surface of the $TiO_2$ film 22 at a temperature of 400° C. by the sputtering method (STEP02). In this step, the orientation is controlled such that the full width at half maximum (FWHM) of the main peak of the X-ray rocking curve in the (111) surface reflection (diffraction) of the Pt film 23 is 3°≤FWHM≤10°.

Subsequently, a $SrRuO_3$ (SRO) film 24 having a film thickness of 20 nm and a perovskite structure is formed as a buffer layer on the upper surface of the Pt film 23 at a temperature of 750° C. by a sputtering method (RF magnetron sputtering) (STEP03).

In the present invention, the amorphous $TiO_2$ film 22, the Pt film 23 having an X-ray rocking curve FWHM of 3° to 10° in the (111) surface, and the SRO film 24 as a buffer layer are desirably formed by the same apparatus. Alternatively, the films formed in the above-described steps are desirably formed without being exposed to the air by apparatuses connected in a load-lock chamber. This operation makes it possible to improve the crystal orientation properties of the PZT film 25 to be formed in the next step.

Next, a tetragonal PZT film 25 having a film thickness of 4 to 5 μm is formed as a piezoelectric crystal film on the upper surface of the SRO film 24 at a temperature of 550° C. by arc discharge reactive ion plating (ADRIP) (STEP04).

The arc discharge reactive ion plating method is a method of forming a film by vaporizing or ionizing a target (PZT) by vacuum arc discharge. Due to the characteristics of arc discharge, the method makes it possible to form a dense film with good adhesion, thus exhibiting high mass-productivity and process stability.

Lastly, a Pt film 26 having a film thickness of 120 nm is formed as the upper electrode (a second electrode) on the upper surface of the PZT film 25 by a sputtering method (STEP05). This completes the piezoelectric element 30 used for the above-described meander-type piezoelectric actuators 6*a* and 6*b*, semi-annular piezoelectric actuators 10*a* and 10*b*, and the like.

By the steps described above, the piezoelectric element 30 is formed, in which the $TiO_2$ film 22 as the adhesion layer, the Pt film 23 as the lower electrode (LE) of the upper surface thereof, the SRO film 24 as the buffer layer of the upper surface of the Pt film 23, the PZT film 25 of the upper surface thereof, and the Pt film 26 as the upper electrode (UE) of the upper surface thereof are stacked on the upper surface of the Si core substrate 27 composed of the Si substrate 20 and the $SiO_2$ film 21, as illustrated in FIG. 6.

The PZT film 25 of the piezoelectric element 30 formed as described above is a polycrystalline film in which a plurality of columnar PZT crystal grains are bound in a direction perpendicular to a surface of the Pt film 23 (SRO film 24) as the lower electrode. In other words, the piezoelectric element 30 has a structure in which the PZT film 25 composed of a group of columnar crystal grains is placed between the surface of the Pt film 23 as the lower electrode and the surface of the Pt film 26 as the upper electrode.

Referring now to FIG. 7, the crystal orientation of the PZT film 25 will be described.

The PZT crystal that forms the PZT film 25 is a tetragonal crystal, and when a <100> direction is defined as an a-axis, a <010> direction is defined as a b-axis, and a <001> direction is defined as a c-axis, the a-axis and b-axis are orthogonal, and the c-axis is orthogonal to a plane containing the a-axis and the b-axis. In addition, the tetragonal crystal is longer in the c-axis direction, and polarized in the c-axis direction.

FIG. 7 is a diagram schematically illustrating two perpendicularly oriented parts 25*a* and 25*a*', and two obliquely oriented parts 25*b* and 25*b*' of the PZT crystal constituting the PZT film 25. Each of the perpendicularly oriented parts 25*a* and 25*a*' and the obliquely oriented parts 25*b* and 25*b*' corresponds to one unit of the crystal grains of the polycrystalline film that forms the PZT film 25. Further, each of the perpendicularly oriented parts 25*a* and 25*a*', and the obliquely oriented parts 25*b* and 25*b*' may coexist in one unit of the polycrystalline body.

In the following description, when the two perpendicularly oriented parts 25*a* and 25*a*' are equivalent, these parts will be described simply as "the perpendicularly oriented parts 25*a*," and when the two obliquely oriented parts 25*b* and 25*b*' are equivalent, these parts will be described simply as "the obliquely oriented parts 25*b*."

In the two perpendicularly oriented parts 25*a*, the c-axis of the PZT crystal is oriented in a direction perpendicular to the plane of the Pt film 23 (the SRO film 24). Further, in the obliquely oriented parts 25*b*, the c-axis is obliquely oriented by the tilt angle $\phi$ (e.g., $\phi$=10°) with respect to the c-axis of the perpendicularly oriented parts 25*a*.

FIG. 7 is a schematic diagram in which the crystal lattice is inclined. However, in the PZT film 25 in which the columnar PZT crystal grains are bound, only the internal orientation axes of the columnar PZT crystal grains are vertical or inclined. Further, although not illustrated, the c-axis of the obliquely oriented part 25*b* is inclined at an arbitrary angle in the radial direction (in all circumferential directions from 0° to 360°) with respect to the c-axis of the perpendicularly oriented part 25*a*. The obliquely oriented parts 25*b* are scattered (dispersed) in the PZT crystal film composed of the perpendicularly oriented parts 25*a*.

The a-axis (b-axis) of each PZT crystal contained in the PZT film 25 is oriented in various directions, with the c-axis, which is oriented perpendicularly to the surface of the Pt film 23 (the SRO film 24), serving as the rotation axis. In other words, the PZT film 25 is a uniaxially oriented polycrystalline body.

Further, the c-axis of each of the perpendicularly oriented parts 25*a* and the obliquely oriented parts 25*b* has an inclination distribution such as, for example, normal distribution. Hereinafter, the c-axis of the perpendicularly oriented parts 25*a* and the c-axes of the obliquely oriented parts 25*b* will be referred to in terms of a representative value in individual c-axis distributions (referred to as the principal c-axis in some cases).

When the voltage of the first electrode (the second electrode) is applied to the lower electrode (the Pt film 23) and the upper electrode (the Pt film 26) sandwiching the PZT film 25 composed of the uniaxially oriented polycrystalline body described above, the c-axis stretches (or compresses), and the surface orthogonal to the c-axis is isotropically compressed (or stretched). This causes the piezoelectric actuators 6*a*, 6*b*, 10*a*, and 10*b* having the piezoelectric elements 30 formed therein to operate as described above. Further, the PZT film 25 isotropically compresses (or stretches) in the film surface direction, thus making the PZT film 25 usable for piezoelectric actuators of any shapes.

Although the above has described the PZT film 25 composed of the PZT crystals containing the perpendicularly oriented parts 25*a* and the obliquely oriented parts 25*b* of the present embodiment, the piezoelectric film is not limited to the PZT crystals as long as the piezoelectric film is composed of uniaxially oriented columnar polycrystalline body containing perpendicularly oriented parts and obliquely oriented parts. Materials include, for example, barium titanate ($BaTiO_3$), lead titanate ($PbTiO_3$), and $(NaK)NbO_3$.

Further, the PZT film 25 composed of the uniaxially oriented columnar polycrystalline body containing the perpendicularly oriented parts 25*a* and the obliquely oriented parts 25*b* of the present embodiment can be formed by the step of forming the amorphous $TiO_2$ film 22 on the Si core substrate 27 (STEP01), the step of forming the Pt film 23 (the lower electrode) having an X-ray rocking curve FWHM of 30 to 10° in the (111) surface (STEP02), and the step of forming the PZT crystal (the piezoelectric film) on the multilayer film formed in the step (STEP03) of forming the buffer layer composed of the SRO film 24 (STEP04).

The manufacturing method of the above-described embodiment is merely an example, and the manufacturing method is not limited to the manufacturing method of the present embodiment as long as a piezoelectric film composed of uniaxially oriented columnar polycrystalline body containing perpendicularly oriented parts and obliquely oriented parts is obtained.

A description will now be given of the structure and the film formation method of the piezoelectric element of a comparative form. The piezoelectric element of the comparative form differs from the method for manufacturing the piezoelectric element 30 of the embodiment only in that, after the $TiO_2$ film is formed (STEP01), the $TiO_2$ film is annealed and the Pt film is formed at a high temperature. The following will describe only the differences.

A PZT film of the comparative form is formed by forming a $TiO_2$ film by the sputtering method at room temperature (e.g., 20° C. to 30° C.), and then annealing the $TiO_2$ film at a temperature of 750° C. by an annealing apparatus to obtain a rutile crystal structure.

Further, a Pt film having a film thickness of 200 nm is formed as a lower electrode on the upper surface of the $TiO_2$ film by the sputtering method at a temperature of approximately 800° C. The X-ray rocking curve FWHM of the (111) surface of the Pt film formed as described above is below 3°. Thus, the PZT film formed under the same conditions as in the embodiment after the formation of the Pt film is composed only of perpendicularly oriented parts.

Referring now to FIG. 8 to FIG. 11, various measurement data of the piezoelectric element 30 (the PZT film 25) of the present embodiment and the piezoelectric element of the comparative form will be described.

Figure 8:
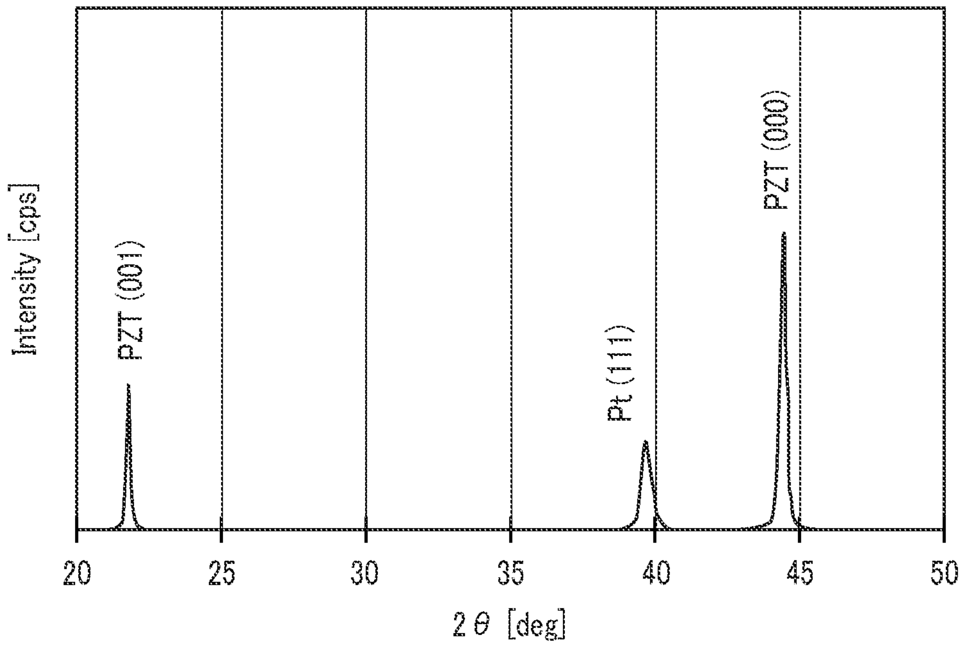
FIG. 8 is a diagram illustrating the results of the X-ray diffraction θ-2θ measurement of the PZT film.

FIG. 8 illustrates the results of measurement of the PZT film 25 obtained by the X-ray diffraction θ-2θ measurement method. In this measurement, the upper electrode (the Pt film 26) shields X-rays, so that a piezoelectric element not provided with an upper electrode is used. Alternatively, a piezoelectric element may be used, in which the Pt film 26 is partially etched after the Pt film 26 is formed as the upper electrode. The crystal orientation properties of the PZT film 25 will remain unchanged even if the upper electrode is not provided.

The X-ray diffraction (XRD) θ-2θ measurement method is a method for analyzing crystals by utilizing Bragg reflection of X-rays based on crystal surface spacing. Specifically, the measurement method is a method in which X-rays are incident at an angle θ with respect to the crystal surface in the horizontal direction of a sample, and among the X-rays reflected (diffracted) from the sample, a reflected X-ray of an angle 2θ with respect to an incident angle θ of the incident X-ray is detected, and the intensity of the reflected X-ray is determined. When the horizontal surface of the sample is defined as a reference, the incident angle of X-rays is ω, so that the measurement method is expressed as ω-2θ in some cases.

Referring to FIG. 8, the horizontal axis represents a reflected X-ray angle 2θ [deg], and the vertical axis represents a reflected X-ray intensity ([cps: counts per sec]). The scanning angle is 20° to 50°, and Cu-2Kα1 is used for incident X-rays.

As illustrated, in the reflected X-ray intensity curve of the θ-2θ measurement of the PZT film 25 in the present embodiment, only the reflection peaks of a (001) surface of the PZT crystal (c-axis orthogonal surface) at 21.82° and a (002) surface of the PZT crystal (the c-axis orthogonal surface) at 44.44° are detected. In addition, a reflection peak of a (111) surface of the Pt film 23, which is the lower electrode, is detected at 39.70°. Thus, it can be seen that the PZT crystals of the PZT film 25 are only c-axis oriented with respect to the (111) surface of the Pt film 23.

Further, in the PZT film of the comparative form, as in the embodiment, only the peaks of the (001) surface reflection and the (002) surface reflection of the PZT film, and the (111) surface reflection of the Pt film were observed (not illustrated). This verified that the PZT film of the comparative form is also c-axis oriented through the SRO film on the (111) surface of the Pt film.

Figure 9:
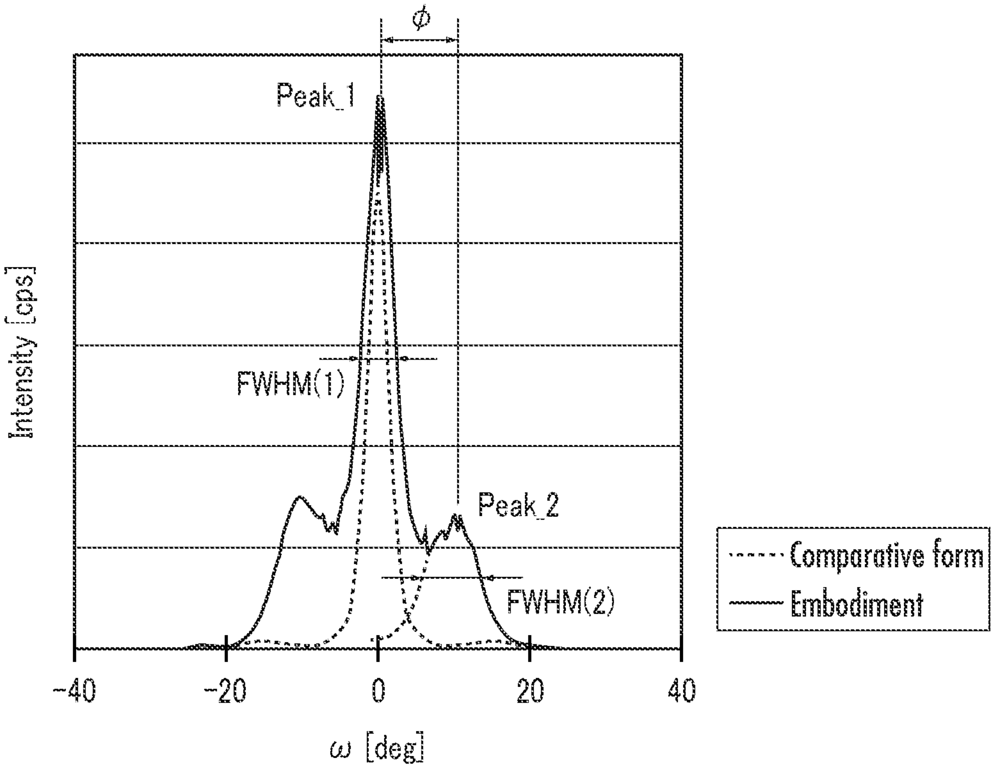
FIG. 9 is a diagram illustrating the results of the X-ray rocking curve measurement of the PZT film.

Referring now to FIG. 9, the results of the X-ray rocking curve measurement of the PZT film 25 will be described.

The X-ray rocking curve measurement is a method in which the incident angle θ of X-rays and the reflection angle 2θ of a detector are fixed so as to obtain the reflection of a particular surface of a crystal, a sample table (PZT film) is scanned ((o scan) from the incident direction to the reflection direction, and the orientation distribution of the crystal surface (c-surface), i.e., the distribution of the crystal orientation axis orthogonal to the crystal surface, is determined from the obtained X-ray reflection intensity curve (rocking curve).

FIG. 9 illustrates the rocking curves of the (001) surfaces of the PZT film 25 of the embodiment and the PZT film of the comparative form. Here, the horizontal axis represents the relative angle Δω [deg] with respect to an angle ω, which is a reference (0°) at which the reflected X-ray intensity is maximum, and the vertical axis represents the reflected X-ray intensity [cps] (on a linear scale graduated in 2000 cps steps). The solid line indicates the rocking curve of the PZT film 25 of the embodiment, while the dashed line indicates the rocking curve of the PZT film of the comparative form. The magnification of the reflected X-ray intensity of the comparative form is adjusted such that the maximum value thereof will be the same as that of the embodiment.

The rocking curve of the PZT film 25 of the embodiment (solid line) includes a main peak having the peak (main peak Pm) at Δω=0°, and subpeaks having peaks, which are different from that of the main peaks, (subpeaks Ps) at two places of Δω=±10°. The FWHMs of the main peak and the subpeaks were 5.0° and 8.36°, respectively. Further, the intensity ratio Rp of reflected X-ray of the subpeak Ps to the main peak Pm (IntPs/IntPm) was 0.25 (2811/11314) for Rp at the subpeak Ps of Δω=10, and 0.30 (3358/11314) for Rp at the subpeak Ps of Δω=−10.

In the PZT film 25, substantially the same rocking curve is obtained at any place, and even when the PZT film 25 is rotated. In other words, in the film surface of the PZT film 25, the perpendicularly oriented part **25*a* and the obliquely oriented part 25*b*** are evenly formed.

Further, when the peak of the main peak (main peak Pm) of the rocking curve is set to Δω=0°, a position Δωps of the peak of the subpeak (subpeak Ps) corresponds to the tilt angle ϕ of the main c-axis of the obliquely oriented part **25*b* with respect to the main c-axis of the perpendicularly oriented part 25*a***. That is, |Δωps|=ϕ (10° in this case) in the present embodiment.

Thus, the perpendicularly oriented part **25*a* is a group of crystals having a c-axis inclination distribution in which the FWHM is 5.0°, and the obliquely oriented part 25*b* is a group of crystals having a c-axis inclination distribution in which the FWHM is 8.36°. Both groups of crystals are discrete groups of crystals that have the c-axis orientations corresponding to the main peak Pm and the subpeak Ps as the centers of distribution. Further, the c-axis of the obliquely oriented part 25*b* is inclined in all circumferential directions from 0° to 360° with respect to the c-axis of the perpendicularly oriented part 25*a*. The abundance ratio of the obliquely oriented part 25*b* to the perpendicularly oriented part 25*a*** is set to an abundance ratio that does not impair the inverse piezoelectric effect (Rp=0.25 and 0.30 in this case).

Meanwhile, the rocking curve of the PZT film of the comparative form (dashed line) has only a unimodal reflection peak based on the (001) surface at Δω=0°. The FWHM of the reflection peak was 3.1°. This means that the PZT crystals of the PZT film of the comparative form are composed of only the perpendicularly oriented parts, and the perpendicularly oriented parts are a group of crystals having a c-axis inclination distribution that is narrower than that of the embodiment. In other words, the PZT film of the comparative form is a PZT film in which the crystal orientation of the PZT crystals exhibits high regularity.

Figure 10:
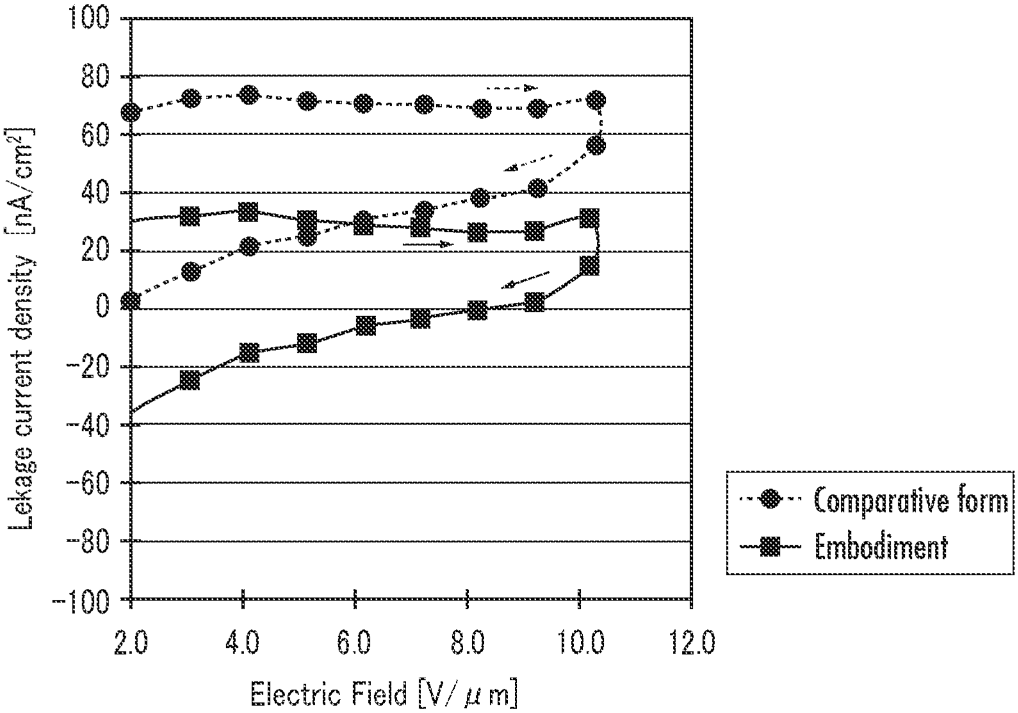
FIG. 10 is a graph illustrating the relationship between the electric field and the leakage current density of the PZT film.

FIG. 10 is a graph illustrating the relationship between the electric field and the leakage current density of the PZT film 25.

In FIG. 10, the horizontal axis represents an electric field [V/μm] applied to the PZT film 25 when a voltage is applied to the lower electrode (the Pt film 23) and the upper electrode (the Pt film 26) of the piezoelectric element 30, and the vertical axis represents the leakage current density [$nA/cm^2$] when a voltage is applied. The relationship between the electric field and the leakage current density of the piezoelectric element 30 of the embodiment is indicated by the solid line, and the relationship between the electric field and the leakage current density of the piezoelectric element of the comparative form is indicated by the dashed line.

In this measurement, after poling (polarizing) the PZT film of the piezoelectric element, the voltage boost side (upper curve) is measured, and then the voltage drop side (lower curve) is measured. The voltage is applied in a pattern of 0[V]→measurement voltage 1→0[V]→measurement voltage 2→and so on. The application of the voltages is performed in regions where the electric field is 2.0 [V/μm] or more, avoiding unstable regions.

The piezoelectric element 30 of the embodiment exhibits a leakage current of approximately 30 [nA/cm$^2$] in the first direction (positive value) when the voltage is boosted (the upper curve of the solid line). Then, when the voltage is stepped down (the lower curve of the solid line), the leakage current flowing in the first direction (positive value) decreases at an electric field of 10.0 to 8.0 [V/μm], the leakage current becomes 0 at an electric field of 8.0 [V/μm], and the leakage current flowing in the second direction (negative value) increases at an electric field of 8.0 to 2.0 [V/μm]. In other words, the piezoelectric element 30 reverses the polarity of the leakage current during voltage step-down except for unstable regions. The reason why the polarity reversal of the leakage current does not immediately take place when the voltage is stepped down is considered to be due to the hysteresis of the piezoelectric crystals.

Meanwhile, the piezoelectric element of the comparative form exhibits a leakage current of approximately 70 [nA/cm$^2$] in the first direction (positive value) when the voltage is boosted (the upper curve of the dashed line). Then, when the voltage is stepped down (the lower curve of the dashed line), the leakage current flowing in the first direction (positive value) at an electric field of 10.0 to 2.0 [V/μm] decreases to approximately 70 to 0 [nA/cm$^2$].

As described above, in the piezoelectric element 30 of the embodiment, when a voltage is applied to the electrodes (the Pt film 23 and the Pt film 26), the leakage current increases when the voltage is boosted and decreases when the voltage is stepped down. In addition, in an early stage of a step-down period, the leakage current reverses its flowing direction and increases. On the other hand, in the piezoelectric element of the comparative form, the leakage current increases when a voltage is boosted, and decreases when the voltage is stepped down.

Such a characteristic that the leakage current reverses its flowing direction and increases when a voltage is stepped down is considered to be due to improved leakage current resistance characteristics during the crystal deformation of the PZT film 25 when the reverse piezoelectric effect (piezoelectric element deformation) is exerted on the piezoelectric element 30 of the embodiment.

Lastly, FIG. 11 is a list comparing the measurement results of the electric field resistance, which is the operating limit electric field of the piezoelectric element 30 of the embodiment and the piezoelectric element of the comparative form, and the endurance time and a piezoelectric constant $d_{31}$ in an endurance test simulating the operating conditions of the meander-type piezoelectric actuators 6*a* and 6*b* and the semi-annular piezoelectric actuators 10*a* and 10*b* used for the two-dimensional light deflector 2.

The electric field resistance, the endurance time, and the piezoelectric constant $d_{31}$ of the piezoelectric element 30 of the embodiment are 21.8 [V/μm], 4000 hrs. or more, and 152 [pm/V], respectively. Meanwhile, the electric field resistance, the endurance time, and the piezoelectric constant $d_{31}$ of the piezoelectric element of the comparative form are 14.0 [V/μm], 1000 hrs. or less, and 152 [pm/V], respectively. Both the electric field resistance and the endurance time have been improved over the piezoelectric element 30 of the comparative embodiment. In addition, regarding the piezoelectric constant $d_{31}$, characteristics equivalent to those of the piezoelectric element of the comparative form are obtained even in the case of the piezoelectric element 30 of the embodiment provided with the obliquely oriented parts 25*b*.

The piezoelectric element 30 of the present embodiment has improved electric field resistance and endurance time due to the structure described below.

Firstly, the PZT crystal that forms the PZT film 25 of the present embodiment is a columnar uniaxially oriented polycrystalline body in which the c-axis of the tetragonal crystal is oriented in the direction orthogonal to the film surface of the Pt film 23 (the SRO film 24) (the directions of the a-axis and the b-axis are arbitrary). Secondly, the columnar uniaxially oriented polycrystalline body is provided with the perpendicularly oriented parts 25*a* and the obliquely oriented parts 25*b*. In addition, the obliquely oriented parts 25*b* are dispersed on the film surface of the PZT film 25. Thirdly, the c-axis of the perpendicularly oriented part 25*a* and the c-axis of the obliquely oriented part 25*b* are provided with the inclination distributions (each of the main peak and the subpeaks has an axis distribution).

With the above-described structure, the film strain that occurs when the PZT crystal is deformed by applying an electric field to the PZT film 25 can be dispersed throughout the PZT film 25 so as to be mitigated. This makes it possible to improve the electric field resistance characteristic and to prolong the endurance time. In particular, the leakage current resistance characteristic is improved by providing the c-axis of the obliquely oriented part 25*b* spaced apart (dispersedly) by an angle ϕ from the c-axis of the perpendicularly oriented part 25*a*, so that the endurance time can be prolonged.

To improve the electric field resistance and the endurance time, the tilt angle ϕ of the c-axis of the obliquely oriented part 25*b* is preferably set to be larger than 6° and below 19°. This is because, if the tilt angle ϕ of the c-axis of the obliquely oriented part 25*b* is set to 6° or less, then the electric field resistance and the endurance time deteriorate due to assimilation to the angle distribution of the c-axis of the perpendicularly oriented part 25*a*. Further, if the tilt angle ϕ of the c-axis of the obliquely oriented part 25*b* is set to 19° or more, then a <111> axis appears, and the piezoelectric properties of the PZT film deteriorate. In addition, the tilt angle ϕ is ideally set to 7° or more and 130 or less, considering the angle distribution of the c-axis of the obliquely oriented part 25*b*.

Further, preferably, the abundance ratio of the obliquely oriented part 25*b* of the PZT film 25 is such that the reflected X-ray intensity ratio Rp is 0.1 to 1%. If Rp is below 0.1, then the effect of the obliquely oriented part 25*b* cannot be obtained. Further, if Rp is greater than 1, then the disturbance of the c-axis orientation of the PZT film 25 becomes excessive, causing the piezoelectric constant $d_{31}$ to lower. A preferable Rp is 0.15 or more at which the improvement of the electric field resistance characteristic by the obliquely oriented part 25*b* is saturated, or 0.45 or less at which an improved endurance life value does not decrease.

As described above, the PZT crystals forming the PZT film 25 of the piezoelectric element 30 of the embodiment include the perpendicularly oriented parts 25*a* having the c-axes in the direction orthogonal to the plane of the Pt film 23 (SRO film 24) and the obliquely oriented parts 25*b* having the c-axes inclined (tilted) by the angle ϕ with respect to the c-axes of the perpendicularly oriented part 25*a*. Further, the PZT crystals allow for the high withstand voltage, the prolonged endurance time, and the piezoelectric constant of $d_{31}$ that is not compromised. This enables the piezoelectric element 30 of the present invention to provide a highly reliable two-dimensional light deflector.

In addition, the improved withstand voltage and endurance time of the piezoelectric element 30 of the embodiment makes it possible to, for example, apply a higher voltage (electric field) to the piezoelectric element 30 to increase the range of movement of the actuators.

The above has described the embodiment for implementing the present invention; however, the present invention is not limited to the above-described embodiment, and modifications can be made as appropriate within a range that does not depart from the gist of the present invention.

For example, in FIG. 6, the thicknesses of the thin films constituting the piezoelectric element 30 and the methods for forming the films are merely examples, and can be changed. The piezoelectric crystal film may be made of a material having piezoelectric properties other than PZT. In addition, the $TiO_2$ film 22 as the adhesion layer and the SRO film 24 as the buffer layer are not constituents essential to the piezoelectric element of the present invention, and may be omitted.

DESCRIPTION OF REFERENCE NUMERALS

1 . . . optical scanner module; 2 . . . two-dimensional light deflector; 3 . . . laser light source; 5 . . . control unit; 6*a*, 6*b* . . . meander-type piezoelectric actuator; 9 . . . micromirror; 10*a*, 10*b* . . . semi-annular piezoelectric actuator; 20 . . . Si substrate; 21 . . . $SiO_2$ film; 22 . . . $TiO_2$ film; 23 . . . Pt film (lower electrode); 24 . . . SRO film; 25 . . . PZT film; 25*a* . . . perpendicularly oriented part; 25*b*, 25*b*' . . . obliquely oriented part; 26 . . . Pt film (upper electrode); 27 . . . Si core substrate; and 30 . . . piezoelectric element.

The invention claimed is:

1. A piezoelectric element comprising:

a substrate, at least one surface of which is a plane;

a first electrode film provided on the plane of the substrate;

a tetragonal piezoelectric crystal film provided on the first electrode film; and a second electrode film provided on a surface of the piezoelectric crystal film, the surface facing the first electrode film, wherein the piezoelectric crystal film is a uniaxially oriented polycrystalline body composed of columnar crystal grains with a c-axis of the tetragonal crystal oriented in a direction perpendicular to the first electrode film, the polycrystalline body includes a perpendicularly oriented part having a c-axis in a direction perpendicular to the first electrode film and an obliquely oriented part having a c-axis inclined with respect to the c-axis of the perpendicularly oriented part, and each of the c-axis of the perpendicularly oriented part and the c-axis of the obliquely oriented part has a distribution, and a c-axis distribution of the obliquely oriented part is discrete with respect to a c-axis distribution of the perpendicularly oriented part.

2. The piezoelectric element according to claim 1, wherein the c-axis of the obliquely oriented part is inclined in all circumferential directions from 0° to 360°, the c-axis of the perpendicularly oriented part being a rotation axis.

3. The piezoelectric element according to claim 1, wherein a tilt angle $\phi$ of the c-axis of the obliquely oriented part with respect to the c-axis of the perpendicularly oriented part of the piezoelectric crystal film is greater than 6° and below 19°.

4. The piezoelectric element according to claim 1, wherein an intensity ratio Rp in an X-ray rocking curve of the obliquely oriented part to the perpendicularly oriented part is 0.1 to 1.

5. The piezoelectric element according to claim 1, wherein the piezoelectric crystal film is lead zirconate titanate and the first electrode film is platinum.

6. The piezoelectric element according to claim 4, wherein a film surface of the first electrode film is a (111) surface.

7. A method for manufacturing the piezoelectric element according to claim 1, the method comprising:

depositing an amorphous metal oxide on the substrate, the at least one surface of which is a plane;

forming, on the metal oxide, the first electrode film, which is made of a conductive metal film, and a film forming surface of which is a (111) surface;

forming an SRO film on the first electrode film;

forming, on the SRO film, a piezoelectric crystal film, which is a tetragonal uniaxially oriented polycrystalline body having the columnar crystal grains in the direction perpendicular to the first electrode film, and which has the perpendicularly oriented part having the c-axis in the direction perpendicular to the first electrode film and the obliquely oriented part having the c-axis inclined at a tilt angle $\phi$ with respect to the c-axis of the perpendicularly oriented part within a range of greater than 6° and below 19° in the columnar crystal grains; and forming the second electrode film on the surface of the piezoelectric crystal film, the surface facing the first electrode film.

8. The method for manufacturing a piezoelectric element according to claim 7, wherein an arc discharge reactive ion plating method is used in the forming the piezoelectric crystal film.

* * * * *